United States Patent [19]

Dixon

[11] 4,158,325
[45] Jun. 19, 1979

[54] METHOD AND APPARATUS FOR PRODUCING A THREE-DIMENSIONAL FORM FROM A PHOTOGRAPHIC IMAGE OF THAT FORM

[76] Inventor: Kenneth G. Dixon, 63 Westfarm Ave., Ashtead, Surrey, England, KT212JZ

[21] Appl. No.: 834,395

[22] Filed: Sep. 19, 1977

[30] Foreign Application Priority Data

Sep. 30, 1976 [GB] United Kingdom ............... 40633/76

[51] Int. Cl.² ...................... B23Q 33/00; B23Q 35/00
[52] U.S. Cl. ........................................ 409/115; 409/86
[58] Field of Search .................... 90/13.1, 13.2, 13 R, 90/24.3

[56] References Cited

FOREIGN PATENT DOCUMENTS 1376941  12/1974  United Kingdom.

Primary Examiner—Gil Weidenfeld
Attorney, Agent, or Firm—Wallenstein, Spangenberg, Hattis & Strampel

[57] ABSTRACT

A method and apparatus for reproducing a three dimensional form from a photographic image of that form comprises, projecting in a parallel beam an image of a series of spaced parallel lines onto the object to be reproduced. The object with the superimposed lines is photographed obliquely, by way of reflection off a spherical mirror such that the lines appear as contour lines on the photograph. This photograph is subsequently projected onto a screen, again via reflection off a spherical mirror. The contour lines on the image on the screen are then traced in turn by a stylus or pen linked via a pantograph to a cutting tool which cuts out a corresponding contour from a block of material.

9 Claims, 5 Drawing Figures

METHOD AND APPARATUS FOR PRODUCING A THREE-DIMENSIONAL FORM FROM A PHOTOGRAPHIC IMAGE OF THAT FORM

BACKGROUND OF THE INVENTION

In the Specification of my British Pat. No. 1,376,941 there is described a method of reproducing a three dimensional form from a photographic image of that form, comprising the steps of, projecting a series of uniformly spaced parallel lines onto the object to be reproduced, photographing the object together with the superimposed lines, projecting an image of the photograph so taken onto a screen, tracing out each of the superimposed contour lines on the image on the screen in turn by way of a stylus linked by way of a pantograph to a cutting tool which is arranged to cut out a corresponding contour on a block of material to be formed into said three dimensional form wherein the said block of material is advanced both horizontally forwards and vertically downwards with respect to the plane of movement of said cutting tool before each new contour line is traced out by said stylus.

As mentioned in the Specification of my British Pat. No. 1,376,941, errors arise using the apparatus described and which must be corrected or compensated for to ensure that the final reproduction of the three dimensional form is an accurate representation of that form.

The first source of error arises from the fact that due to the necessarily finite distance between the object and the projector which projects the series of parallel lines onto the object, a spreading out of the light rays takes place and the spacing of the projected lines superimposed on the object will be slightly greater at points on the object which are further from the projector, than at points which are nearer the projector. Following from this, a further error arises due to the fact that the plane of each projected line is not parallel to adjacent lines and each contour cut will not be accurate unless the block of material being cut is rotated about a horizontal axis to compensate for this. A first object of the present invention is to remove this source of error. Apart from the errors just discussed for the projector, which also apply to the camera, a second source of error arises from the fact that for the lines to appear as accurate contour lines on the photograph taken of the object together with the superimposed lines, it is necessary for the camera to view the object at an angle of 90° to the object-projector axis. This is not satisfactory in practice as the resolution between the lines on parts of the object almost perpendicular to the projector—object axis would be too small for each to be correctly identified in the subsequent stage of the method. As described in my earlier patent an angle of 36° is used in place of the theoretical 90° and a compensation for this angle is made in a subsequent stage in the process.

In my earlier patent, this compensation is achieved mechanically by linking the sideways movement of the cutting tool to a compensatory sideways movement of the block of material as it is cut by the tool. It is a second object of the present invention to produce this compensation optically so eliminating the complication necessary to produce the mechanical compensation described in my earlier patent.

SUMMARY OF THE PRESENT INVENTION

This invention relates to a method of reproducing a three dimensional form from a photographic image of that form, comprising the steps of, projecting an image of a series of uniformly spaced parallel lines onto the object to be reproduced in the form of a parallel beam, photographing the object together with the superimposed lines by way of reflection off a first spherical mirror, projecting an image of the photograph so taken onto a screen by way of a reflection off a second identical spherical mirror, tracing out each of the superimposed contour lines on the image on the screen in turn by way of a stylus linked by way of a pantograph to a cutting tool which is arranged to cut out a corresponding contour on a block of material to be formed into said three dimensional form wherein the said block of material is advanced both horizontally forwards and vertically downwards with respect to the plane of movement of said cutting tool before each new contour line is traced out by said stylus.

The invention also provides apparatus for reproducing a three dimensional form from a photographic image of that form comprising means for projecting an image of a series of uniformly spaced parallel lines onto the object to be reproduced by way of reflection from a concave cylindrical mirror, means for producing an image of the object together with the superimposed lines by way of reflection from two successive concave spherical mirrors, stylus means for tracing out horizontally spaced contour lines superimposed on the said image, a pantograph for transmitting movements of said stylus to a cutting tool, a support for a block of material to be formed into said three dimensional form, means for advancing said both vertically and horizontally before each new contour line is traced out by said stylus.

BRIEF DESCRIPTION OF THE DRAWINGS

A preferred embodiment of the present invention will now be described with reference to the accompanying drawings in which.

DESCRIPTION OF THE PREFERRED EMBODIMENT

Figure 1:
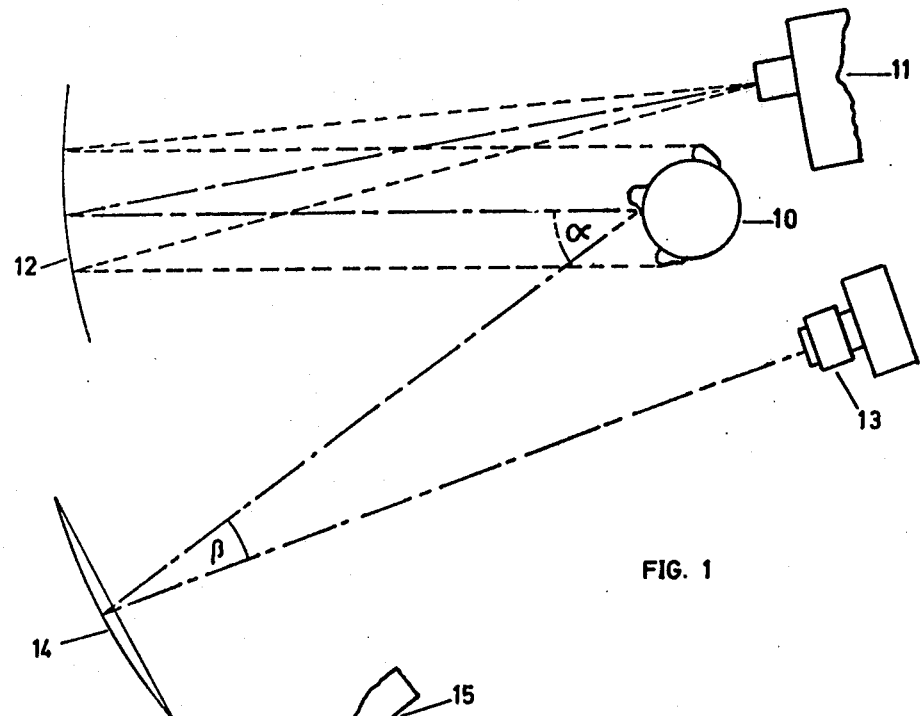
FIG. 1 is a plan view of the apparatus used for projecting the contour lines onto the object and for photographing the object plus superimposed lines.

In the initial stage of the process an object 10 to be reproduced, for example a person's head, is positioned as shown in FIG. 1 which is a plan view of the set-up. A projector 11 projects an image of a pattern of horizontally spaced vertical guide lines of predetermined uniform spacing which are reflected off a concave cylindrical mirror 12 onto the object 10. The lens of the projector 11 is positioned accurately at the focus of the mirror 12 and thus the image reflected off the mirror 12 is in the form of a parallel beam. As an alternative to using a cylindrical mirror, a parabolic mirror could be used but such mirrors are very much more costly. The use of a spherical mirror would cause distortion progressively outwards at the top and bottom, both sides of the vertical centre line and they would be unsatisfactory. The only distortion produced by a cylindrical mirror would be to elongate the vertical guide lines, the only effect of which is to reduce the intensity of the light on the final image falling on the object 10. The source of light for the projector 11 is preferably a flash bulb or an electronic flash which is fired by the camera used in the second stage of the process now to be described.

The object 10 together with the superimposed image of the guide lines is photographed by a camera 13 by way of a spherical mirror 14. The camera is positioned so as to take the photograph at an angle α to the direction of the projected guide lines. For the lines superimposed on the object 10 to appear as accurate contour lines on the photograph taken by the camera 13, it is theoretically necessary for the angle α to be 90°. As discussed earlier, this is not satisfactory in practice and an angle α of 36° is used and is later compensated for as will be described.

Figure 2:
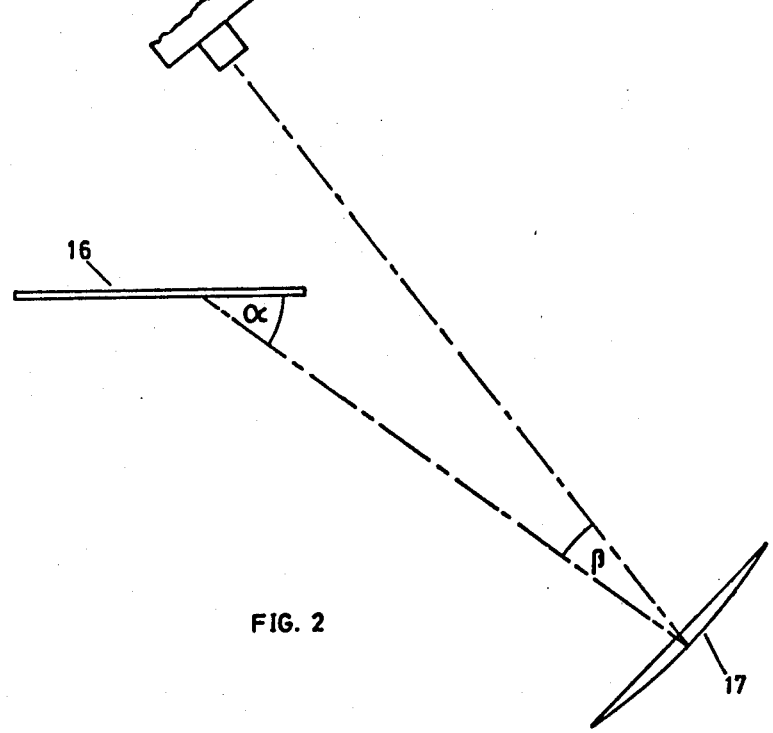
FIG. 2 is a side view showing the apparatus used to project an image of the photograph taken using the apparatus shown in FIG. 1 onto a screen of a machine used to produce the final object.

The camera 13 is positioned at the focal point of the mirror 14, i.e. at half the radius of curvature. The angle 'β' is as small as possible. Because of the use of a spherical mirror and the angle 'β' the image recorded on the film of the camera 13 will be distorted. However if this recorded image is subsequently projected via a second spherical mirror identical to the mirror 14, these distortions will cancel out. This is shown in FIG. 2, which is an elevation view in which the the image recorded by the camera 13 is projected from a projector 15 having a lens of the same focal length as that of the camera 13 onto a translucent screen 16 via a second identical spherical mirror 17, the angle of reflection being the same angle 'β' as in the first stage. Similarly the projector-mirror distance must be equal to the camera-mirror distance.

The use of the angle α of 36° can be corrected for by projecting the image onto the screen 16 at the angle α=36°. Only one size of image can be correctly focussed onto the screen 16. The screen 16 is supported on a base frame 28. This screen may be of ground glass or other transparent material with the ground face uppermost. A mechanical slide 18 is supported in a frame 19 which is connected to a vertical column 20 above the frame 28. A lead screw 21 is connected between the two members 18 and 19 being connected at one end to the slide 18 by way of a bearing in a bracket 22 which allows the screw 21 to rotate but does not allow any relative axial movement. The other end of the screw 21 passes through a threaded nut 23 secured to the frame 19. Rotation of the screw 21 by a fixed angular amount, which may be determined by a circular dial 24 graduated in degrees and secured to the end of the lead screw 21, causes the slide 18 to be advanced by a small amount relative to the frame 19. To facilitate this the lead screw 21 is rotated by a small lever 25 which is connected to the screw 21 via a one way roller clutch (not shown) incorporated within the dial 24. Angular movement of the lever 25 is limited by one fixed stop 26 and one adjustable stop 27. The clutch may be disconnected from the lead screw 21 to enable the slide 18 to be retracted to its starting (uppermost) position on the frame 19.

A fixed frame is mounted on the lower end of the slide 18, to which is secured a plate 30 on which is mounted a block 31 of clay or similar plastic material which is to be formed into a three dimensional representation of the image 14.

A cutting tool 32 carried on a supporting frame 33, is mounted in a vertical bearing secured to the connected ends of arms 34 and 35 which form part of a pantograph mechanism. The other end of the arm 34 is connected to an arm 36, which is pivotally mounted at one end to the base frame 28 and at the other end to one end of an arm 37, to which is also connected the other end of arm 35. A stylus or ink pen 38 is connected to the free end of the arm 37.

Figure 3:
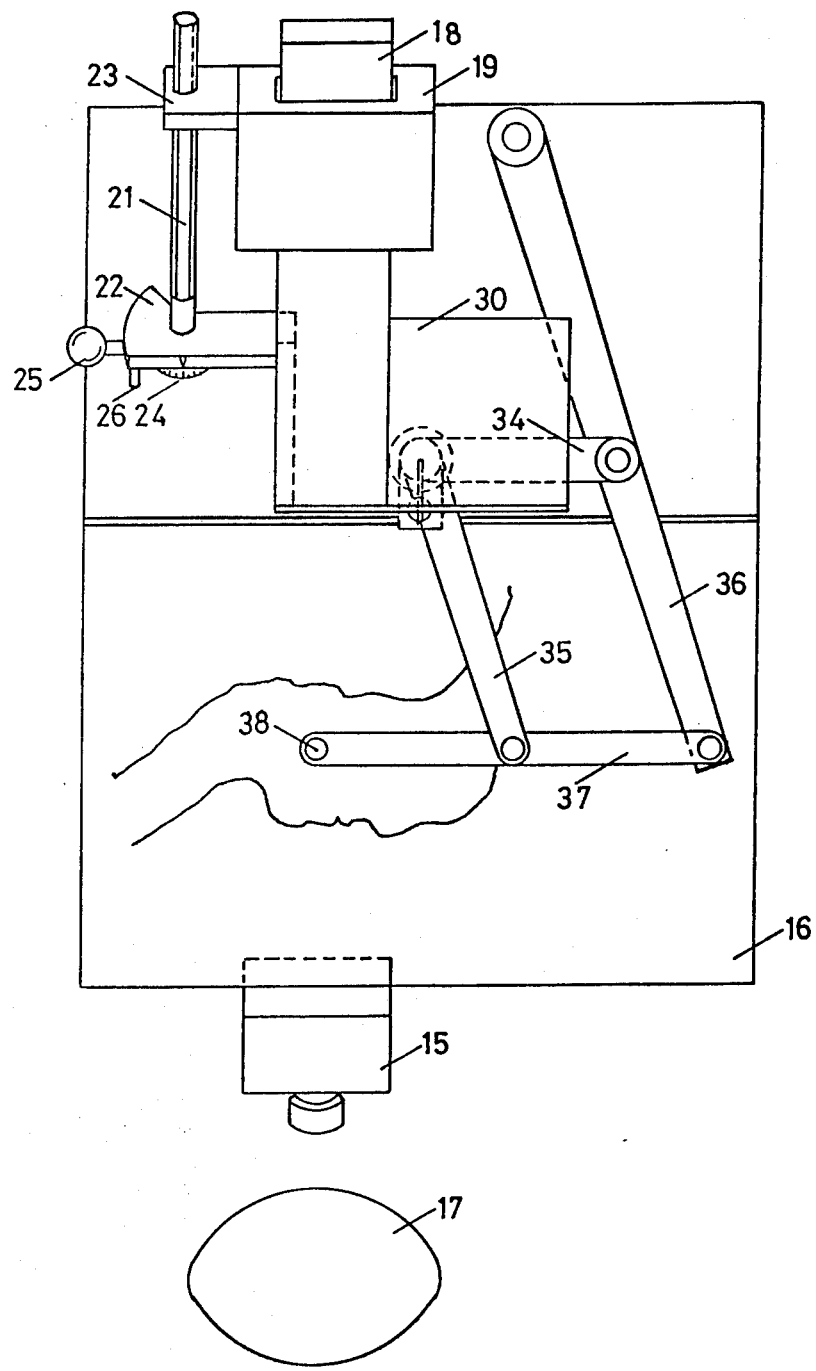
FIGS. 3, 4 and 5 are respectively a plan, front and side view of the apparatus used in the second stage of the process.
Figure 4:
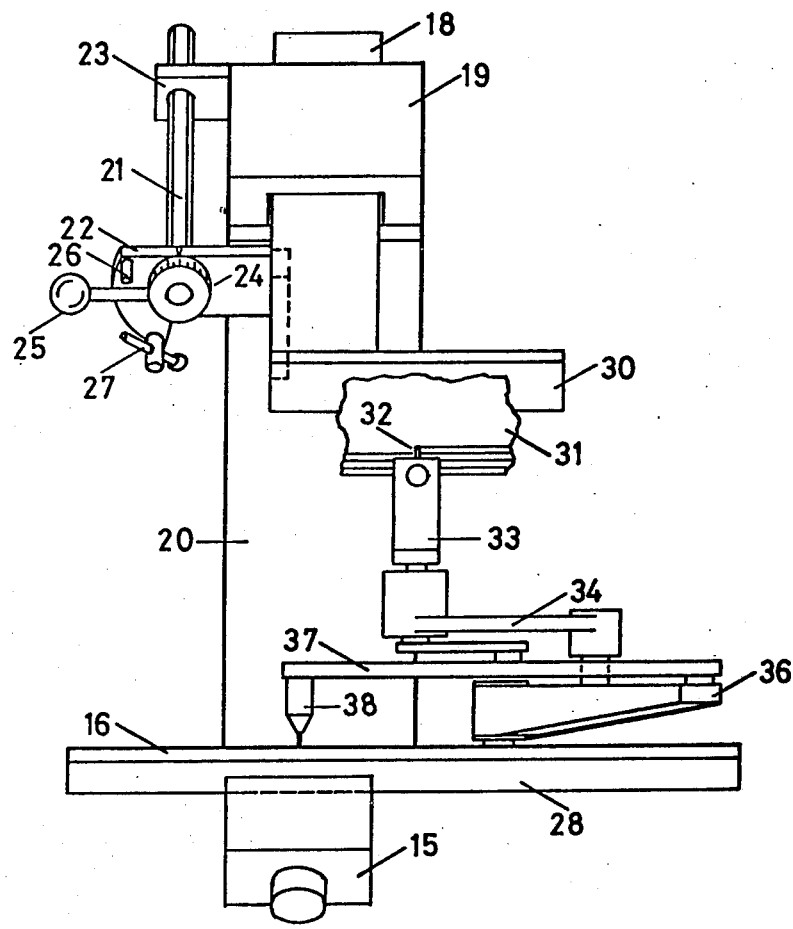
Figure 4:
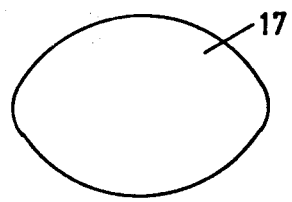

To use the machine, the slide 18 is set at a zero position at its uppermost position. The pen or stylus 38 is then moved so as to accurately follow the rearmost contour line on the image projected onto the screen 16, which in the position of the image shown in FIG. 3 will be a contour line in the region of the ear. The use of an ink-pen will give a clear indication of which line has been traced. The movement of the pen 38 is transmitted via the pantograph formed by the arms 34-37, to the cutting tool 32 which accurately cuts out a corresponding line in the clay block 31. The ratio of the dimensions of the contour line traced by the pen 38 to the contour cut by the tool 32, is determined in known manner by the ratio of the length of the arms 34-37 forming the pantograph. Changes in the size of the reproduction require alteration to the ratio of the lengths of the arms 34-37.

Figure 5:
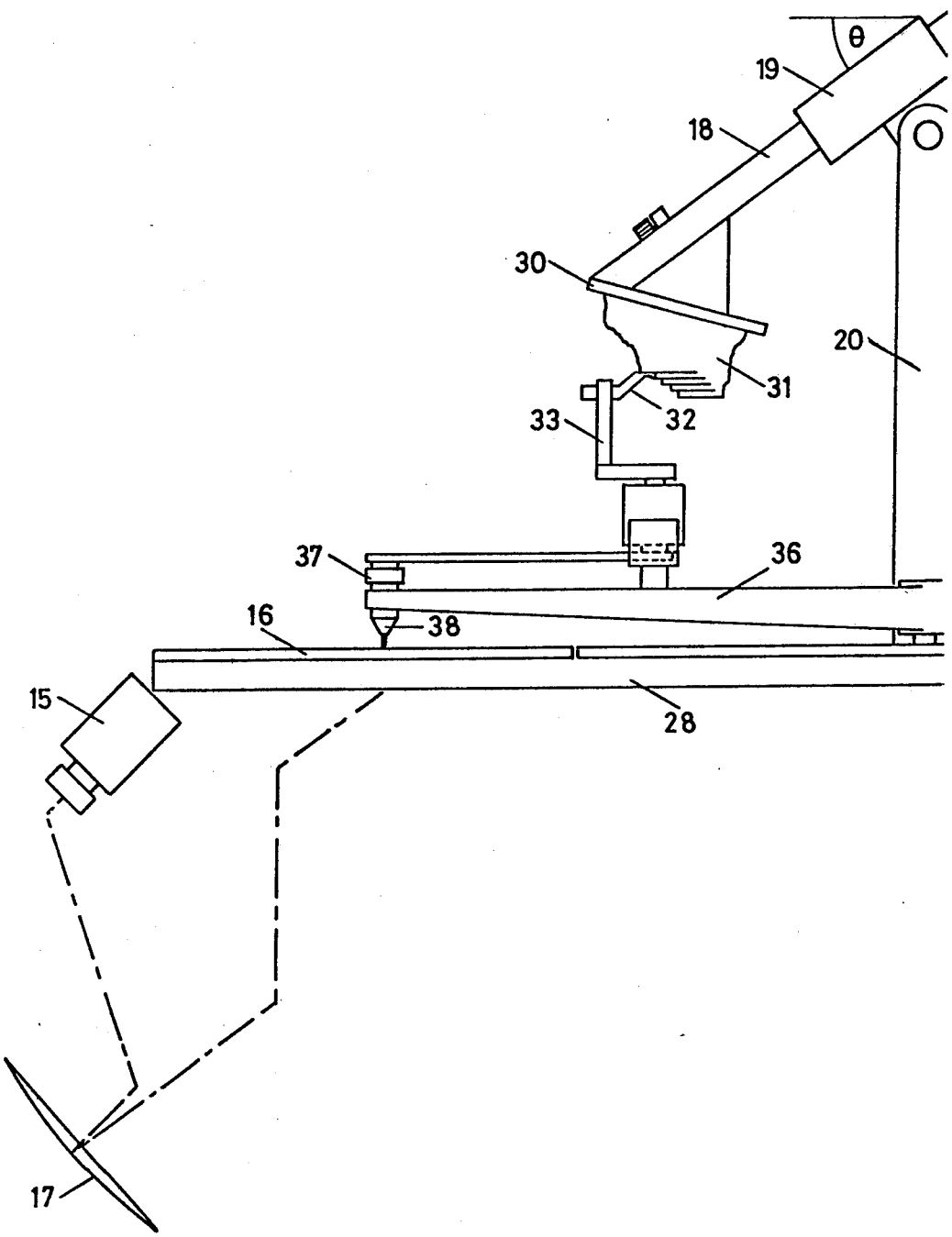

The slide 18 is then advanced by rotating the screw 21 a fixed amount as described. As can be seen from FIG. 5, the slide 18 is arranged at an angle θ to the horizontal. In this way movement of the slide 18 advances the block of clay 31, both horizontally and vertically in an area of the subject which was normal to the projector/subject line. The amount of the horizontal movement is chosen to correspond to the distance between contour lines on the image on the screen 16, scaled down by an appropriate amount, whilst the vertical movement is chosen to correspond to the degree of relief required in the three dimensional form to be produced. After the slide 18 has been advanced by the chosen amount, the pen 38 is then traced over the next contour line on the image on the screen 16.

This action is repeated until the line in the image representing the outer profile of the subject has been traced.

In practice, it is advantageous to cut the block 31 roughly to shape first and then to go over it again with a finishing tool. The roughing tool is so mounted in the holder 33 that its tip is slightly further back and lower than the corresponding position of the finishing tool. In this way the form cut by roughing tool will be slightly oversize and therefore leaves a small amount of material to be removed by the finishing tool subsequent operations.

With the roughing tool it is not necessary to trace each contour line on the image 14. It is sufficient to trace every fifth line for example and to advance the slide 18 by five times the fixed amount for one line. In the subsequent operation with the finishing tool, each contour line is followed and the slide 18 is consequently advanced by the fixed amount each time.

The plate 30 complete with the moulded clay block 31 is then removed from the machine and finishing operations are applied to it.

By the substitution of the simple cutting tools 32 by, for example, a rotary cutter, hard materials such as wood, plaster or metal could be substituted for the block 31 of plastic material such as clay.

As previously described, the use of the mirrors 14 and 17 only allows one size of image to be projected onto the screen 16 and size adjustment of the model produced by the machine is achieved by adjustment of the linkages of the pantograph arms 34, 35, 36 and 37. An alternative would be to photograph the corrected image on the screen 16, at a direction normal to the screen and to project the photograph of this image normally onto the screen 16 and adjust the image size by adjusting the projector-screen distance. The need for adjustable linkages on the pantograph arms would be avoided in this alternative.

What is claimed is:

1. A method of reproducing a three dimensional form from a photographic image of that form, comprising the steps of, projecting an image of a series of uniformly spaced parallel lines onto the object to be reproduced in the form of a parallel beam, photographing the object together with the superimposed lines by way of reflection off a first spherical mirror, projecting an image of the photograph so taken onto a screen by way of a second identical spherical mirror, tracing out each of the superimposed contour lines on the image on the screen in turn by way of a stylus linked by way of a pantograph to a cutting tool which is arranged to cut out a corresponding contour on a block of material to be formed into said three dimensional form wherein the said block of material is advanced both horizontally forwards and vertically downwards with respect to the plane of movement of said cutting tool before each new contour line is traced out by said stylus.

2. A method as claimed in claim 1 wherein the focal plane of the camera taking the photograph of said object by way of reflection off said first spherical mirror is positioned at the focal point of said mirror.

3. A method as claimed in claim 1 wherein the focal plane of the projector is positioned at the focal point of said second spherical mirror.

4. A method as claimed in claim 1 wherein the angle subtended at said first spherical mirror between said camera and a given point on said object is equal to the corresponding angle subtended said second spherical mirror between said projector and the point on said image on said screen corresponding to said given point on said object.

5. A method as claimed in claim 1 wherein said parallel beam of uniformly spaced parallel lines is produced by way of reflection off a cylindrical mirror from a source positioned at the focus of said cylindrical mirror.

6. Apparatus for reproducing a three dimensional form from a photographic image of that form comprising means for projecting an image of a series of uniformly spaced parallel lines onto the object to be reproduced by way of reflection from a concave cylindrical mirror, means for reproducing an image of the object together with the superimposed lines by way of reflection from two successive concave spherical mirrors, stylus means for tracing out horizontally spaced contour lines superimposed on the said image, a pantograph for transmitting movements of said stylus to a cutting tool, a support for a block of material to be formed into said three dimensional form, means for advancing said support both vertically and horizontally before each new contour line is traced out by said stylus.

7. Apparatus as claimed in claim 6 wherein the focal plane of the camera taking the photograph of said object by way of reflection off said first spherical mirror is positioned at the focal point of said mirror.

8. Apparatus as claimed in claim 6 wherein the focal plane of the projector is positioned at the focal point of said second spherical mirror.

9. Apparatus as claimed in claim 6 wherein the angle subtended at said first spherical mirror between said camera and a given point on said object is equal to the corresponding angle subtended said second spherical mirror between said projector and the point on said image on said screen corresponding to said given point on said object.

* * * * *